United States Patent
Lei et al.

(10) Patent No.: US 9,867,319 B2
(45) Date of Patent: Jan. 9, 2018

(54) VEHICLE POWER MODULE ASSEMBLIES AND MANIFOLDS

(71) Applicant: Ford Global Technologies, LLC, Dearborn, MI (US)

(72) Inventors: Guangyin Lei, Dearborn Heights, MI (US); Michael W. Degner, Novi, MI (US); Edward Chan-Jiun Jih, Troy, MI (US); Chingchi Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/162,913

(22) Filed: May 24, 2016

(65) Prior Publication Data

US 2017/0347484 A1 Nov. 30, 2017

(51) Int. Cl.
*H05K 7/20* (2006.01)
*B60K 6/26* (2007.10)
(Continued)

(52) U.S. Cl.
CPC .............. *H05K 7/2089* (2013.01); *B60K 6/26* (2013.01); *B60K 6/383* (2013.01); *B60K 6/40* (2013.01);
(Continued)

(58) Field of Classification Search
CPC ............ H05K 7/2089; H05K 7/20927; H05K 7/20218; H05K 7/20272; H05K 7/1432; H01L 23/473; H01H 9/52; H01H 2009/526; B60K 6/26; B60K 6/383; B60K 6/40; B60K 6/543; B60K 2006/92; H02M 7/003; H02P 27/06; B60Y 2400/61;
(Continued)

(56) References Cited

U.S. PATENT DOCUMENTS 5,161,089 A * 11/1992 Chu ..................... H01L 23/4338 165/185
5,170,319 A * 12/1992 Chao-Fan Chu ... H01L 23/4338 165/170
(Continued)

FOREIGN PATENT DOCUMENTS

EP 1795852 A1 6/2007
WO 2015159141 A1 10/2015

*Primary Examiner* — Dion R Ferguson
*Assistant Examiner* — Amir Jalali
(74) *Attorney, Agent, or Firm* — David B. Kelley; Brooks Kushman P.C.

(57) ABSTRACT

A vehicle power module assembly includes a modular manifold, an upper frame, and a plurality of power stages. The modular manifold includes a first base unit defining an inlet chamber, a second base unit defining an outlet chamber, a mid-unit defining one or more ports open to the chambers, and an upper unit defining a first set of slots and a second set of slots in fluid communication with the chambers via the ports. The plurality of power stages is housed within the frame and each of the power stages are spaced from one another to define inner channels therebetween. The chambers, channels, and ports are arranged with one another such that coolant flowing through the inner channels is in thermal communication with the power stages. The mid-unit may further include flow guides each sized to partially extend into one of the inner channels.

18 Claims, 9 Drawing Sheets

(51) Int. Cl.
*B60K 6/543* (2007.10)
*B60K 6/40* (2007.10)
*B60L 15/00* (2006.01)
*B60K 6/383* (2007.10)
*H02P 27/06* (2006.01)
*H02M 7/00* (2006.01)
*B60K 6/38* (2007.10)

(52) U.S. Cl.
CPC ............ *B60K 6/543* (2013.01); *B60L 15/007* (2013.01); *H02M 7/003* (2013.01); *H02P 27/06* (2013.01); *B60K 2006/381* (2013.01); *B60Y 2200/92* (2013.01); *B60Y 2400/61* (2013.01); *Y10S 903/906* (2013.01); *Y10S 903/913* (2013.01); *Y10S 903/918* (2013.01); *Y10S 903/93* (2013.01)

(58) Field of Classification Search
CPC ............ Y10S 903/906; Y10S 903/913; Y10S 903/918; Y10S 903/93
USPC .......... 361/689, 699; 165/80.4–80.5, 104.33; 257/714
See application file for complete search history.

(56) References Cited

U.S. PATENT DOCUMENTS

| | | | |
|---|---|---|---|
| 5,841,634 A * | 11/1998 | Visser | F28F 3/12 165/104.33 |
| 7,569,957 B2 | 8/2009 | Aoki et al. | |
| 7,835,151 B2 | 11/2010 | Olesen | |
| 8,151,868 B2 | 4/2012 | Inagaki | |
| 9,042,100 B2 | 5/2015 | Kang | |
| 9,638,477 B1 * | 5/2017 | Choi | F28F 3/12 |
| 2006/0096299 A1 | 5/2006 | Mamitsu et al. | |
| 2006/0120040 A1 | 6/2006 | Chen | |
| 2008/0186751 A1 * | 8/2008 | Tokuyama | H01L 23/473 363/131 |
| 2008/0251909 A1 * | 10/2008 | Tokuyama | H01L 23/473 257/706 |
| 2011/0164719 A1 * | 7/2011 | Aleshin | G21C 3/30 376/313 |
| 2013/0032230 A1 | 2/2013 | Olesen et al. | |
| 2016/0021784 A1 * | 1/2016 | Choi | H05K 7/20927 165/80.4 |
| 2016/0308480 A1 | 10/2016 | Wang et al. | |
| 2016/0309622 A1 | 10/2016 | Lei et al. | |
| 2016/0309624 A1 | 10/2016 | Lei et al. | |
| 2017/0045300 A1 * | 2/2017 | Boday | B23P 15/26 |
| 2017/0164516 A1 * | 6/2017 | Scolton | H05K 7/20281 |

* cited by examiner

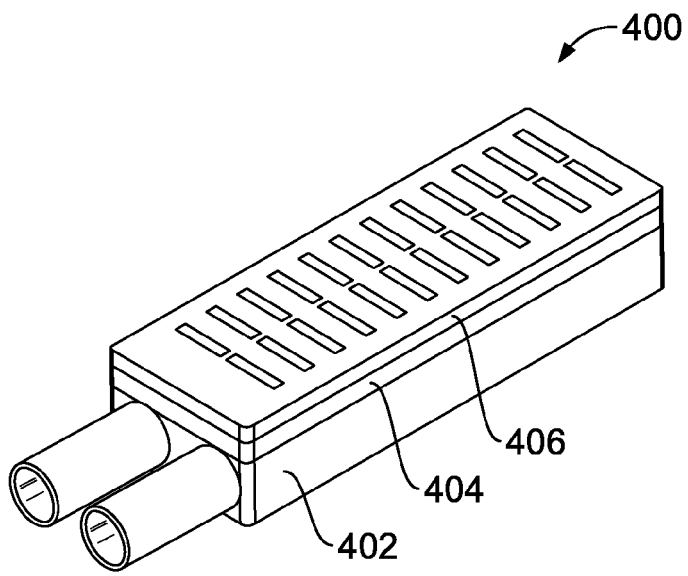
FIG. 7
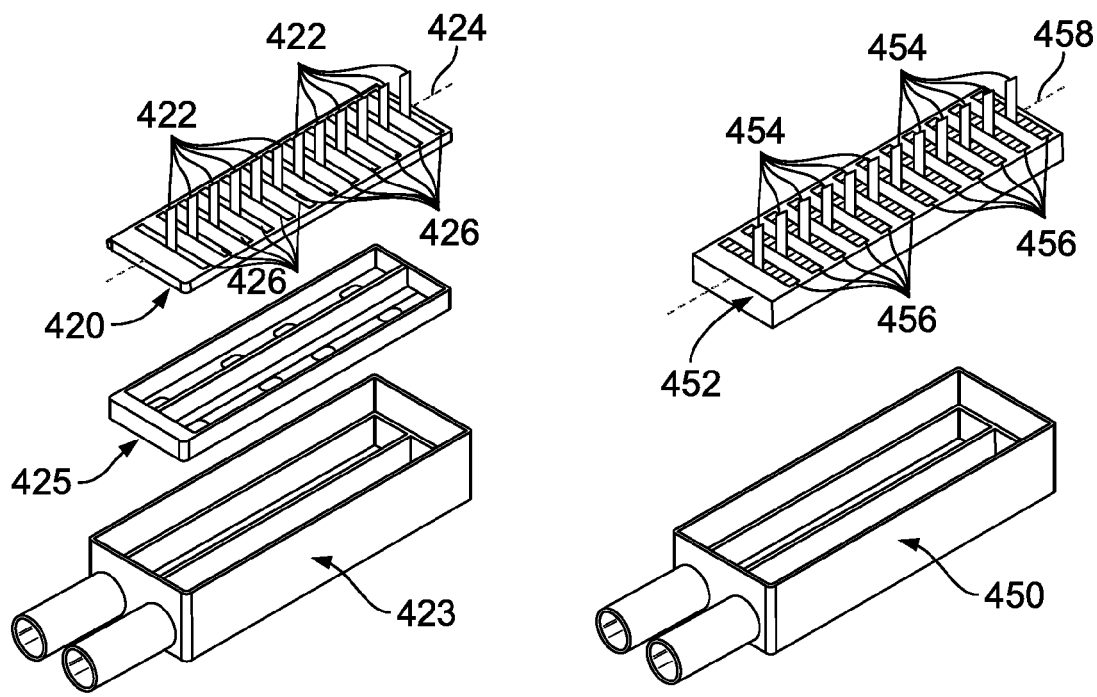
FIG. 8  FIG. 9

VEHICLE POWER MODULE ASSEMBLIES AND MANIFOLDS

TECHNICAL FIELD

The present disclosure relates to thermal management systems of power module assemblies for automotive vehicles.

BACKGROUND

Electrified vehicles such as battery-electric vehicles (BEVs), plug-in hybrid-electric vehicles (PHEVs), mild hybrid-electric vehicles (MHEVs), or full hybrid-electric vehicles (FHEVs) contain an energy storage device, such as a high voltage (HV) battery. Vehicle components, such as power modules, may generate heat during operation. Thermal management systems may assist in managing thermal conditions of the vehicle components.

SUMMARY

A vehicle power module assembly includes a modular manifold, an upper frame, and a plurality of power stages. The modular manifold includes a first base unit defining an inlet chamber, a second base unit defining an outlet chamber, a mid-unit defining one or more ports open to the chambers, and an upper unit defining a first set of slots and a second set of slots in fluid communication with the chambers via the ports. The upper frame is supported by the manifold. The plurality of power stages is housed within the frame and each of the power stages are spaced from one another to define inner channels therebetween. The chambers, channels, and ports are arranged with one another such that coolant flowing through the inner channels is in thermal communication with the power stages. The mid-unit may further include flow guides spaced apart from one another and each sized to partially extend into one of the inner channels. Each of the flow guides may direct coolant flowing therethrough about exterior surfaces of each of the plurality of power stages. The mid-unit may include a first mid-unit sized for disposal within a cavity defined by the first base unit and defining a first set of the ports, and a second mid-unit sized for disposal within a cavity defined by the second base unit and defining a second set of the ports. Each of the cavities may be sized such that the mid-unit and upper unit are located above the inlet chamber and outlet chamber. An inlet may be open to the inlet chamber and an outlet may be open to the outlet chamber. The mid-unit and upper unit may be formed as a single component. The mid-unit may further define a wall dividing a cavity of the mid-unit such that the ports are not all in fluid communication with one another when the upper unit is mounted to the mid-unit.

A vehicle power module assembly includes a modular manifold, an upper frame, and an inlet and outlet. The modular manifold includes a base unit defining a partitioned cavity, and a transition unit sized for disposal upon a partition. The upper frame houses power stages spaced from one another to define inner channels open to the cavity via transition channels of the transition unit. The inlet and outlet open to the cavity such that coolant travels therebetween via the cavity and the channels. The transition unit may further include flow guides spaced apart from one another and each sized to partially extend into one of the inner channels and the flow guides may direct coolant flowing therethrough about exterior surfaces of each of the power stages. The upper frame may define flow guides within the inner channels to direct coolant flowing therethrough about exterior surfaces of each of the power stages. The upper frame may further include a plurality of frames each sized to house one of the power stages. Each of the power stages may include electrical components extending therefrom and the upper frame may be over molded about the power stages such that the electrical components extend therethrough. Screens may be disposed within each of the transition channels to influence a flow of coolant traveling therethrough. The base unit may further define a ridge extending about the perimeter of the partitioned cavity sized for the upper frame to rest thereupon.

A multi-component manifold for a power module assembly includes a base unit, a mid-unit, and an upper unit. The base unit includes an inlet and an outlet, and defines an inlet chamber open to the inlet and an outlet chamber open to the outlet. The mid-unit is sized for mounting to the base unit and defines a plurality of spaced ports separated from one another by a mid-unit wall. The upper unit is sized for mounting to the mid-unit and defines a first set of slots open to the inlet chamber via respective ports and a second set of slots open to the outlet chamber via respective ports. The units are arranged with one another to receive an upper frame thereupon and such that inner channels of the upper frame are in fluid communication with the chambers for coolant to flow therethrough and in fluid communication with power stages disposed adjacent the inner channels. The units may be further arranged with one another to receive the upper frame over molded upon the power stages. The units may be further arranged with one another to receive the upper frame comprising a stack of frames. The base unit may further define a ridge offset from an upper edge of the base unit such that the mid-unit rests upon the ridge and within an upper portion of the base unit. The upper unit may include a set of flow guides located along a central axis, spaced apart from one another, extending from between two of the slots, and each sized to partially extend into one of the inner channels. The flow guides may direct coolant flowing therethrough about exterior surfaces of each of the power stages. The assembly may further include an insert unit including a lower portion sized for disposal within the mid-unit. The lower portion may separate a cavity of the mid-unit into two chambers and include extensions to influence a flow of coolant therein.

BRIEF DESCRIPTION OF THE DRAWINGS

FIG. 7 is a perspective view of an example of a base unit assembly of a power module assembly.

FIG. 8 is an exploded perspective view of another example of a base unit assembly of the power module assembly of FIG. 3.

FIG. 9 is an exploded perspective view of another example of a base unit assembly of the power module assembly of FIG. 3.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
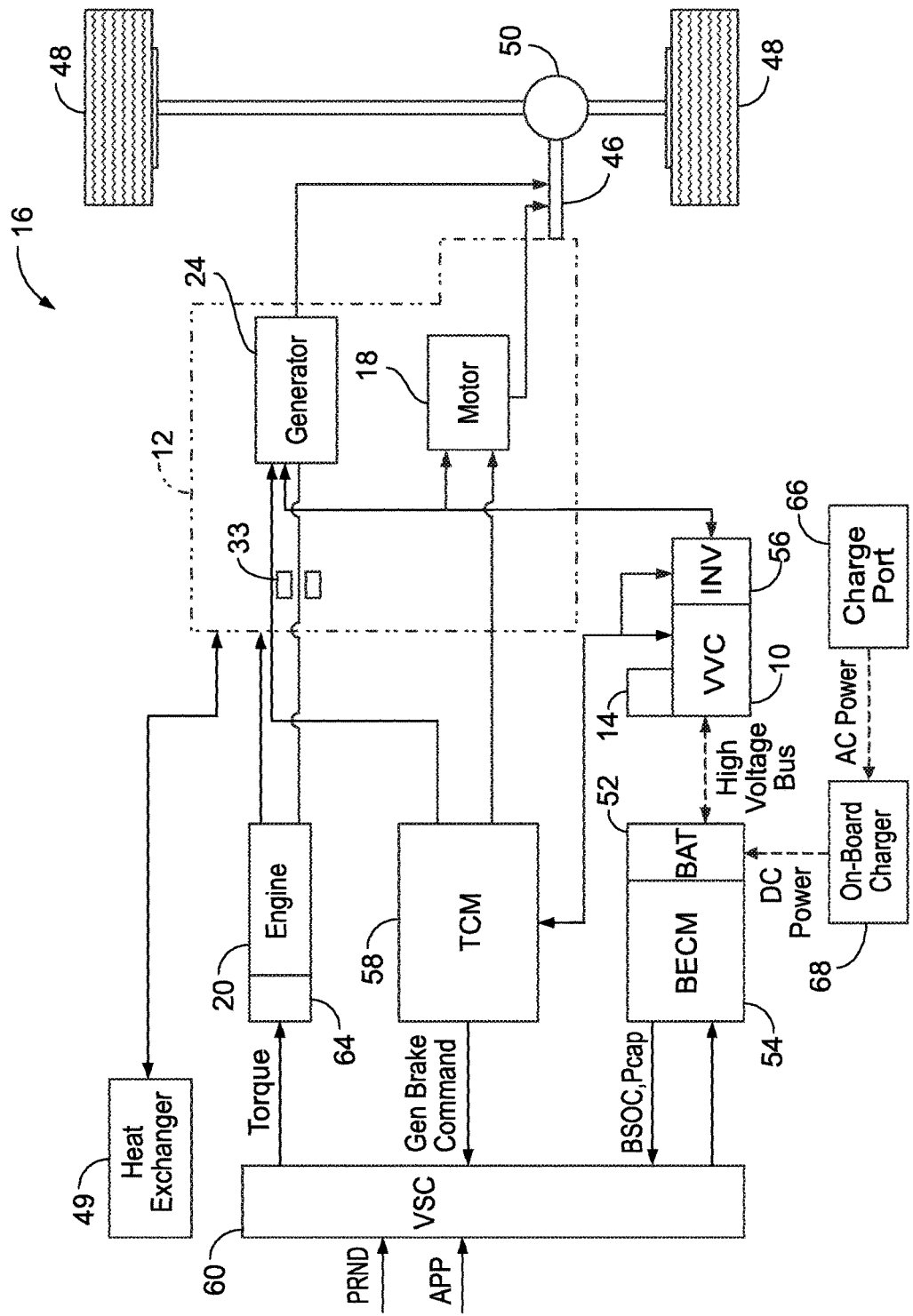
FIG. 1 is a schematic diagram of an example hybrid vehicle.

An example of a PHEV is depicted in FIG. 1, referred to generally as a vehicle 16 herein. The vehicle 16 may include a transmission 12 and is an example of an electric vehicle propelled by an electric machine 18 with assistance from an internal combustion engine 20. The vehicle 16 may be connectable to an external power grid. The electric machine 18 may be an AC electric motor depicted as a motor 18 in FIG. 1. The electric machine 18 receives electrical power and provides torque for vehicle propulsion. The electric machine 18 may also function as a generator for converting mechanical power into electrical power through regenerative braking.

The transmission 12 may be a power-split configuration. The transmission 12 may include the first electric machine 18 and a second electric machine 24. The second electric machine 24 may be an AC electric motor depicted as a generator 24 in FIG. 1. Similar to the first electric machine 18, the second electric machine 24 may receive electrical power and provide output torque. The second electric machine 24 may also operate as a generator for converting mechanical power into electrical power and optimizing power flow through the transmission 12. In other embodiments, the transmission may not have a power-split configuration.

The transmission 12 may include a planetary gear unit (not shown) and may operate as a continuously variable transmission and without any fixed or step ratios. The transmission 12 may also include a one-way clutch (O.W.C.) and a generator brake 33. The O.W.C. may be coupled to an output shaft of the engine 20 to control a direction of rotation of the output shaft. The O.W.C. may prevent the transmission 12 from back-driving the engine 20. The generator brake 33 may be coupled to an output shaft of the second electric machine 24. The generator brake 33 may be activated to "brake" or prevent rotation of the output shaft of the second electric machine 24. Alternatively, the O.W.C. and the generator brake 33 may be replaced by implementing control strategies for the engine 20 and the second electric machine 24. The transmission 12 may be connected to a driveshaft 46. The driveshaft 46 may be coupled to a pair of drive wheels 48 through a differential 50. An output gear (not shown) of the transmission may assist in transferring torque between the transmission 12 and the drive wheels 48. The transmission 12 may also be in communication with a heat exchanger 49 or an automatic transmission fluid cooler (not shown) for cooling the transmission fluid.

The vehicle 16 includes an energy storage device, such as a traction battery 52 for storing electrical energy. The battery 52 may be a HV battery capable of outputting electrical power to operate the first electric machine 18 and the second electric machine 24 as further described below. The battery 52 may also receive electrical power from the first electric machine 18 and the second electric machine 24 when they are operating as generators. The battery 52 may be a battery pack made up of several battery modules (not shown), where each battery module contains a plurality of battery cells (not shown). Other embodiments of the vehicle 16 contemplate alternative types of energy storage devices, such as capacitors and fuel cells (not shown) that may supplement or replace the battery 52.

A high voltage bus may electrically connect the battery 52 to the first electric machine 18 and to the second electric machine 24. For example, the vehicle 16 may include a battery energy control module (BECM) 54 for controlling the battery 52. The BECM 54 may receive input indicative of certain vehicle conditions and battery conditions, such as battery temperature, voltage, and current. The BECM 54 may calculate and estimate parameters of the battery 52, such as a battery state of charge (BSOC) and a battery power capability (Pcap). The BECM 54 may provide output that is indicative of the BSOC and Pcap to other vehicle systems and controllers.

The vehicle 16 may include a DC-DC converter or variable voltage converter (VVC) 10 and an inverter 56. The VVC 10 and the inverter 56 may be electrically connected between the battery 52 and the first electric machine 18 and the second electric machine 24. The VVC 10 may "boost" or increase a voltage potential of electrical power provided by the battery 52. The VVC 10 may also "buck" or decrease voltage potential of the electrical power provided to the battery 52. The inverter 56 may invert DC power supplied by the battery 52 via the VVC 10 to AC power for operating each of the electric machines 18 and 24. The inverter 56 may also rectify AC power provided by each of the electric machines 18 and 24 to DC for charging the battery 52. In other examples, the transmission 12 may operate with multiple inverters, such as one inverter associated with each of the electric machine 18 and 24. The VVC 10 includes an inductor assembly 14 (further described in relation to FIG. 2).

The transmission 12 is shown in communication with a transmission control module (TCM) 58 for controlling the electric machines 18 and 24, the VVC 10, and the inverter 56. The TCM 58 may be configured to monitor conditions of each of the electric machines 18 and 24 such as position, speed, and power consumption. The TCM 58 may also monitor electrical parameters (e.g., voltage and current) at various locations within the VVC 10 and the inverter 56. The TCM 58 provides output signals corresponding to this information for other vehicle systems to utilize.

The vehicle 16 may include a vehicle system controller (VSC) 60 that communicates with other vehicle systems and controllers for coordinating operations thereof. Although shown as a single controller, it is contemplated that the VSC 60 may include multiple controllers to control multiple vehicle systems and components according to an overall vehicle control logic or software.

The vehicle controllers, such as the VSC 60 and the TCM 58, may include various configurations of microprocessors, ASICs, ICs, memory (e.g., FLASH, ROM, RAM, EPROM and/or EEPROM), and software code to cooperate with one another to perform vehicle operations. The controllers may also include predetermined data, or "look up tables," which are accessible from the memory and may be based on calculations and test data. This predetermined data may be utilized by the controllers to facilitate control of the vehicle operations. The VSC 60 may communicate with other vehicle systems and controllers (e.g., the BECM 54 and the TCM 58) over one or more wired or wireless connections using bus protocols such as CAN and LIN. The VSC 60 may receive input (PRND) that represents a current position of the transmission 12 (e.g., park, reverse, neutral or drive). The VSC 60 may also receive input (APP) that represents an accelerator pedal position. The VSC 60 may provide outputs representative of a desired wheel torque, desired engine speed, and a generator brake command to the TCM 58; and contactor control to the BECM 54.

The vehicle 16 may include an engine control module (ECM) 64 for controlling the engine 20. The VSC 60 provides output, such as desired engine torque, to the ECM 64 that may be based on a number of input signals including APP and may correspond to a driver's request for vehicle propulsion.

The battery 52 may periodically receive AC energy from an external power supply or grid via a charge port 66. The vehicle 16 may also include an on-board charger 68 which receives the AC energy from the charge port 66. The charger 68 may include AC/DC conversion capability to convert the received AC energy into DC energy suitable for charging the battery 52 during a recharge operation. Although illustrated and described in the context of a PHEV, it is contemplated that the inverter 56 may be implemented with other types of electrified vehicles, such as a FHEV or a BEV.

Figure 2:
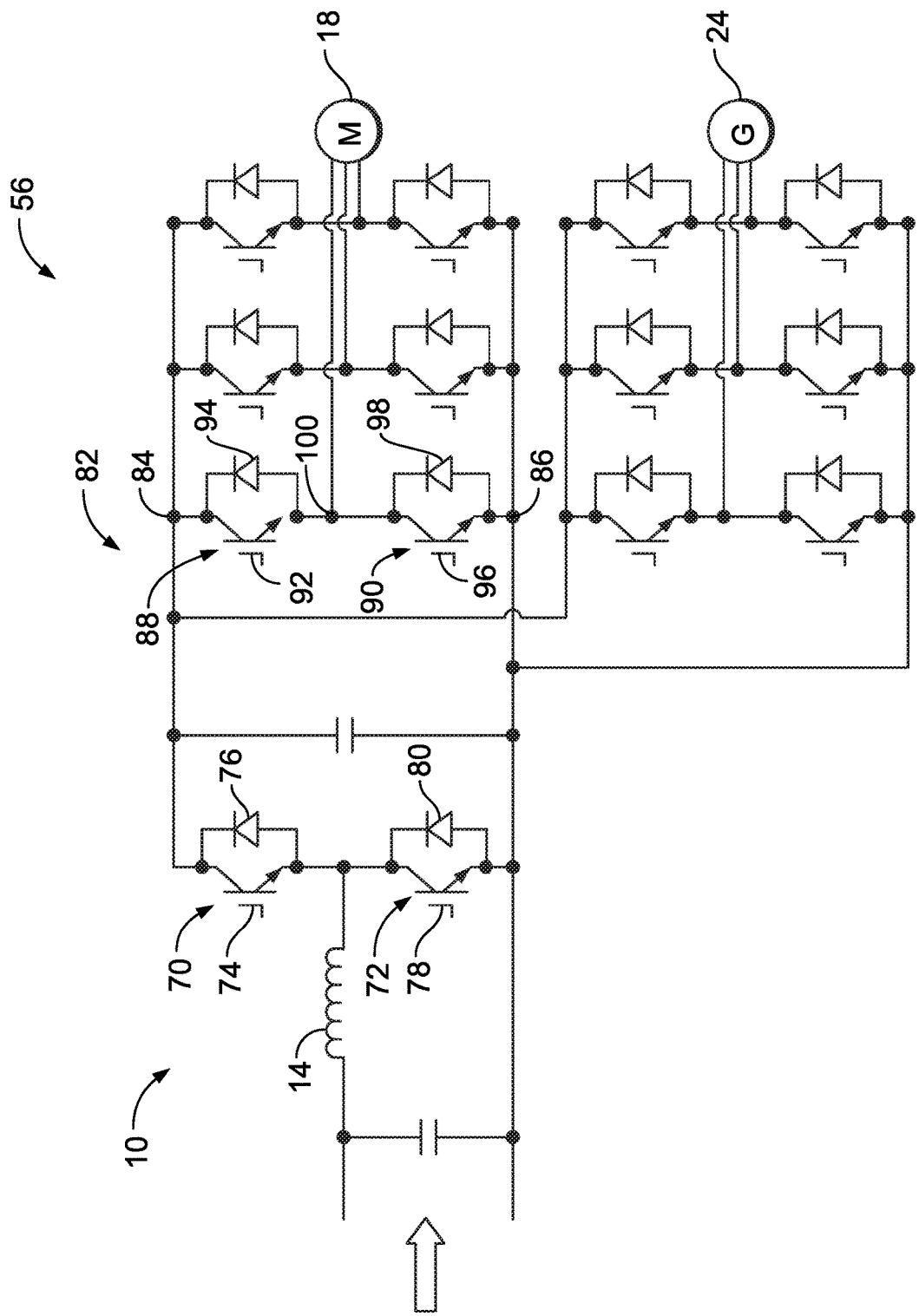
FIG. 2 is a schematic diagram of a variable voltage converter and power inverter.

Referring to FIG. 2, an example of an electrical schematic of the VVC 10 and the inverter 56 is shown. The VVC 10 may include a first switching unit 70 and a second switching unit 72 for boosting the input voltage (V_bat) to provide output voltage (V_dc). The first switching unit 70 is shown with a first transistor 74 connected in parallel to a first diode 76 and with their polarities switched (referred to as anti-parallel herein). The second switching unit 72 is shown with a second transistor 78 connected anti-parallel to a second diode 80. Each of the transistors 74 and 78 may be a type of controllable switch (e.g., an insulated gate bipolar transistor (IGBT) or field-effect transistor (FET)). Additionally, each of the transistors 74 and 78 may be individually controlled by the TCM 58. The inductor assembly 14 is depicted as an input inductor that is connected in series between the battery 52 and the switching units 70 and 72. The inductor assembly 14 may generate magnetic flux when a current is supplied. When the current flowing through the inductor assembly 14 changes, a time-varying magnetic field is created and a voltage is induced. Other embodiments of the VVC 10 may include alternative circuit configurations (e.g., more than two switches).

The inverter 56 may include a plurality of half-bridges 82 stacked in an assembly. Each of the half-bridges 82 may be packaged as a power stage. In the illustrated example, the inverter 56 includes six half-bridges (though FIG. 2 labels only one complete half-bridge 82), three for the motor 18 and three for the generator 24. Each of the half bridges 82 may include a positive DC lead 84 that is coupled to a positive DC node from the battery 52 and a negative DC lead 86 that is coupled to a negative DC node from the battery 52. Each of the half bridges 82 may also include a first switching unit 88 and a second switching unit 90. The first switching unit 88 includes a first transistor 92 connected in parallel to a first diode 94. The second switching unit 90 includes a second transistor 96 connected in parallel to a second diode 98. The first transistor 92 and the second transistors 96 may be IGBTs or FETs. The first switching unit 88 and the second switching unit 90 of each of the half-bridges 82 converts the DC power of the battery 52 into a single phase AC output at the AC lead 100. Each of the AC leads 100 is electrically connected to the motor 18 or generator 24. In this example, three of the AC leads 100 are electrically connected to the motor 18 and the other three AC leads 100 are electrically connected to the generator 24.

Components of VVCs and inverters may be heated and/or cooled using a liquid thermal management system, an air thermal management system, or other method as known in the art. In one example of a liquid thermal management system, a thermal plate may be in thermal communication with the components of the VVC or inverter. A system, such as a pressurized system, may control a flow of coolant through the thermal plates to assist in dissipating heat from the components, such as heat generated during a voltage conversion. The thermal management system may be arranged with and/or supported by a power module assembly such that the thermal plates are in thermal communication with the components to facilitate cooling thereof by the coolant.

Figure 3:
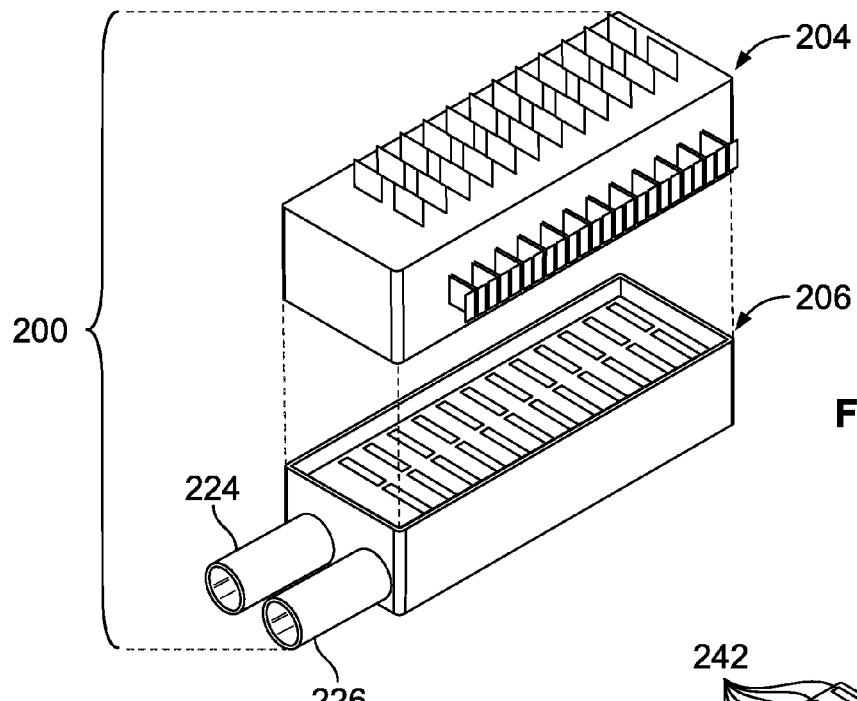
FIG. 3 is an exploded perspective view of an example of portions of a power module assembly.

FIG. 3 shows an example of a portion of a power module assembly for use with an electrified vehicle, referred to generally as a power module assembly 200 herein. The power module assembly 200 may include an upper frame unit 204 mounted to a base unit assembly 206. The upper frame unit 204 may house one or more power stages therein and as further described below. Multiple configurations are available for the base unit assembly 206 to assist in distributing coolant to the upper frame unit 204 to assist in managing thermal conditions of the power stages housed therein.

Figure 4A:
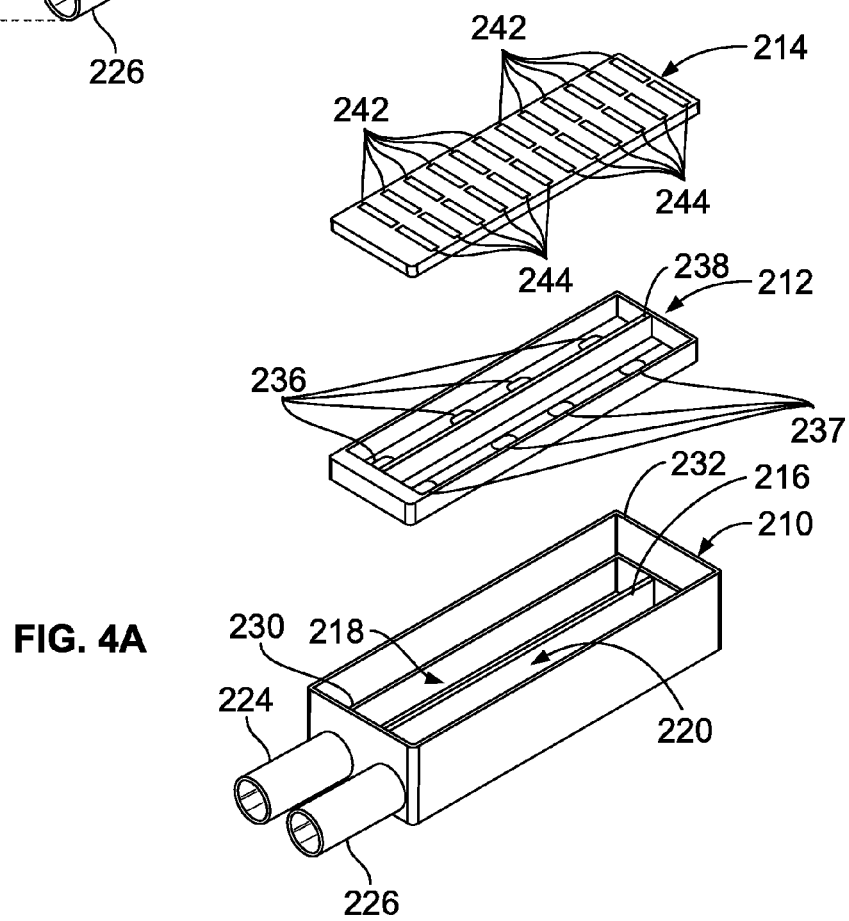
FIG. 4A is an exploded perspective view of an example of a base unit assembly of the power module assembly of FIG. 3.

The base unit assembly 206 may be modular and include multiple components to operate as a manifold for coolant delivery to the upper frame unit 204. For example, FIG. 4A shows an example of the base unit assembly 206 which may include multiple components. The base unit assembly 206 may include a base unit 210, a mid-unit 212, and an upper unit 214. The base unit 210 may include a partition 216 separating a first chamber 218 and a second chamber 220. An inlet 224 and an outlet 226 may be mounted to the base unit 210. The inlet 224 may be open to the first chamber 218 and the outlet 226 may be open to the second chamber 220. The base unit 210 may define a ridge 230 extending about a perimeter of the base unit 210 and spaced from an edge 232 of the base unit 210. For example, the ridge 230 may be spaced from the edge 232 such that the midunit 212 and the upper unit 214 may rest thereupon and within the base unit 210.

The mid-unit 212 may define one or more ports and a wall 238. A first set of the ports 236 may be separated from a second set of the ports 237 by the wall 238. The wall 238 may span a length of the mid-unit 212. The upper unit 214 may define a first set of slots 242 and a second set of slots 244. The slots of each set may be spaced from one another. A screen may be disposed in each of the slots 242 and the slots 244 to influence a flow of coolant traveling therethrough.

Figure 4B:
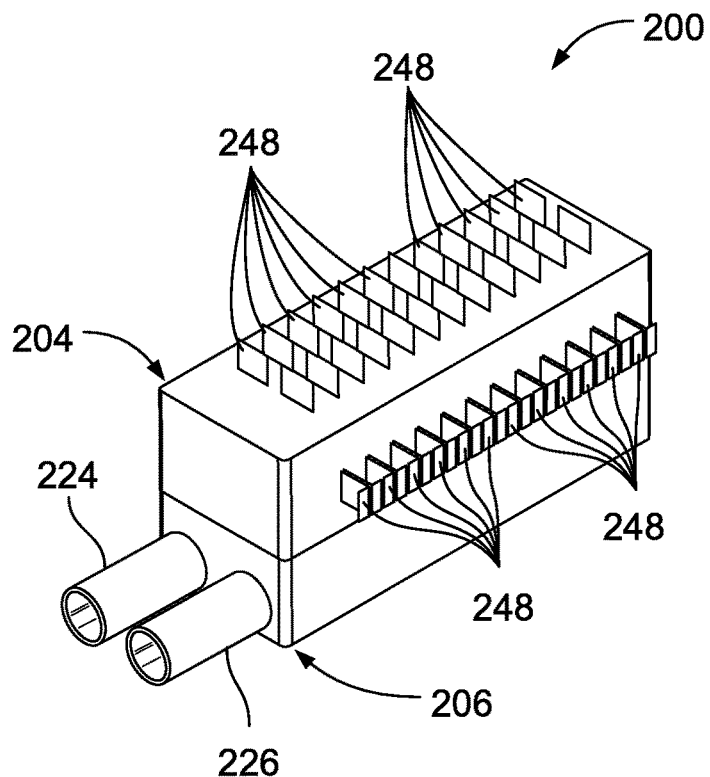
FIG. 4B is a perspective view of the power module assembly of FIG. 3 shown assembled.
Figure 5:
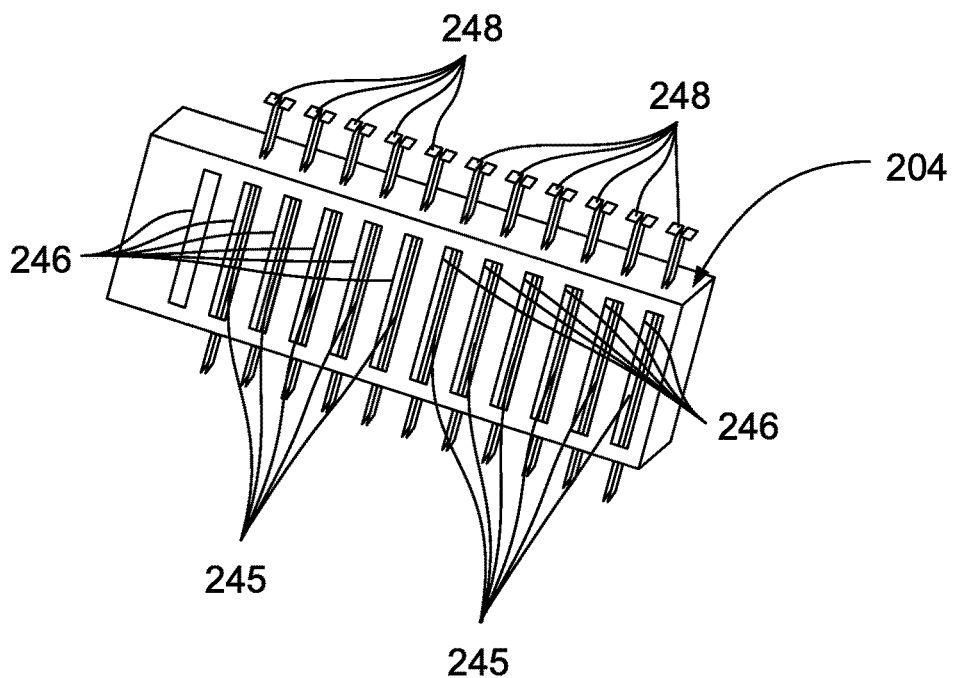
FIG. 5 is a lower perspective view of an upper frame unit of the power module assembly of FIG. 3 showing power stages spaced from one another to define inner channels therebetween.

FIG. 4B shows the upper frame unit 204 and the base unit assembly 206 secured to one another. FIG. 5 shows a lower perspective view of the upper frame unit 204. As mentioned above, the upper frame unit 204 may house one or more power stages therein. For example, power stages 245 may be housed within the upper frame unit 204. In this example, the upper frame unit 204 is shown over molded about the power stages 245. The power stages 245 may be spaced apart from one another to define inner channels 246 therebetween. The inner channels 246 may operate as a path for coolant to flow therethrough and such that the coolant may assist in managing thermal conditions of the power stages 245. For example, coolant flowing through the inner channels 246 may draw heat from the power stages 245. Each of the power stages 245 may include electrical components 248 extending therefrom. Examples of the electrical components 248 include semiconductors, a direct current (DC) terminal, an alternating (AC) terminal, and busbars. The electrical components 248 may extend through the upper frame unit 204 for electrical connection with other vehicle components.

The upper frame unit 204 and the base unit assembly 206 may be arranged with one another such that the inner channels 246 are in fluid communication with the first chamber 218 and the second chamber 220. For example, the inner channels 246 may align with the slots 242 and the slots 244 (or other examples of slots described herein) such that coolant flowing from the first chamber 218 may then pass through the respective ports 236 and the slots 242 enroute to the inner channels 246 to draw heat from the power stages 245. The coolant may then flow from the inner channels 246 through the slots 244 and the respective ports 237 enroute to the second chamber 220.

Figure 6:
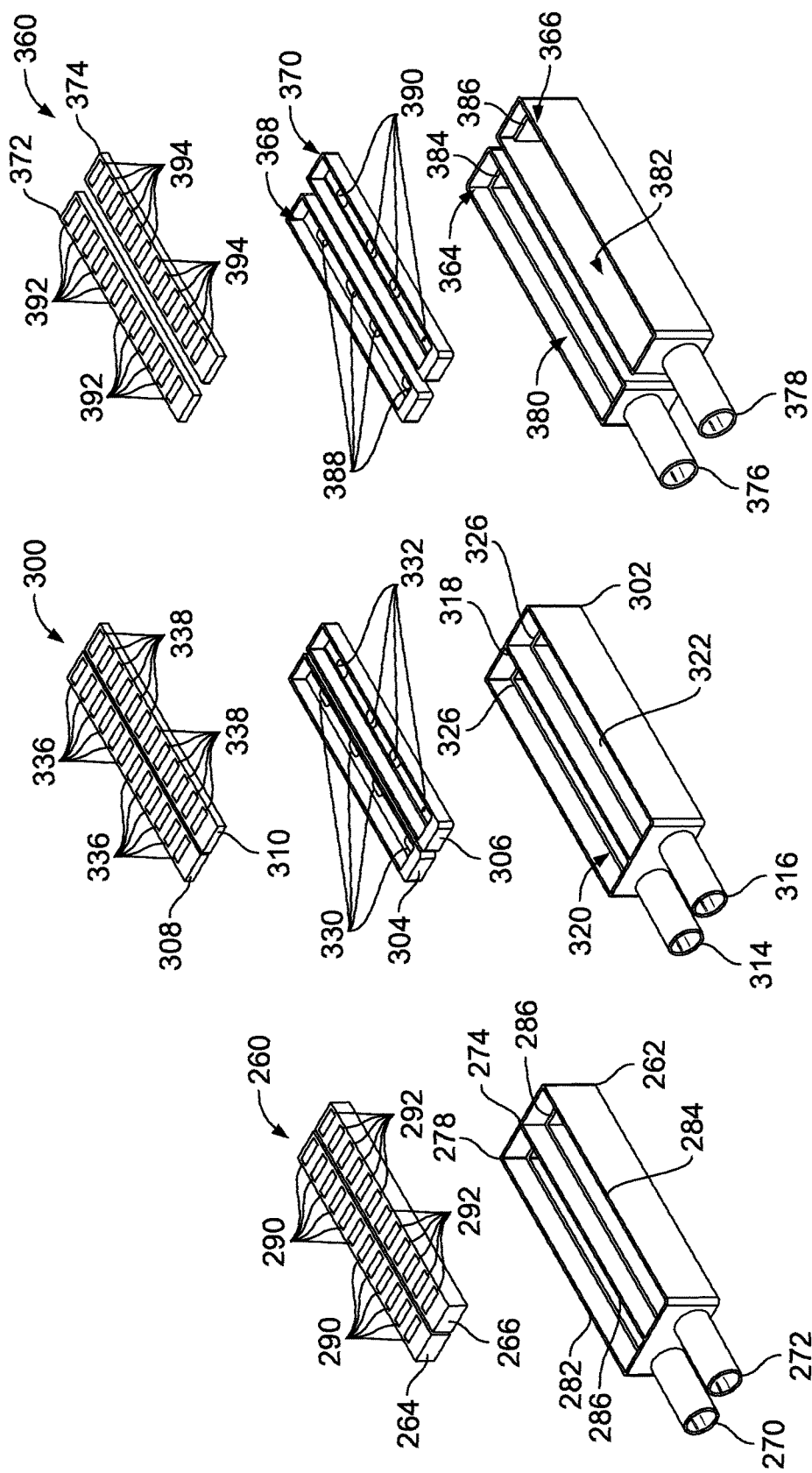
FIG. 6A is an exploded perspective view of another example of a base unit assembly of the power module assembly of FIG. 3.
FIG. 6B is an exploded perspective view of another example of a base unit assembly of the power module assembly of FIG. 3.
FIG. 6C is an exploded perspective view of yet another example of a base unit assembly of the power module assembly of FIG. 3.

FIGS. 6A and 6B show other examples of configurations for the base unit assembly 206. In FIG. 6A, aspects of a mid-unit and upper unit are shown combined as a single component. For example, a base unit assembly 260 may include a base unit 262, a first slot unit 264, and a second slot unit 266. The base unit 262 may include an inlet 270, and outlet 272, and a partition 274. The partition 274 may extend from a base portion of the base unit 262 to an edge 278 of the base unit 262. The partition 274 may split a cavity of the base unit 262 into a first chamber 282 and a second chamber 284. The inlet 270 may be open to the first chamber 282 and the outlet 272 may be open to the second chamber 284. The base unit 262 may define a ridge 286 in each chamber to assist in supporting the first slot unit 264 and the second slot unit 266.

For example, the first slot unit 264 may be sized for disposal within the cavity, upon the ridge 286, and above the first chamber 282. The second slot unit 266 may be sized for disposal within the cavity, upon the ridge 286, and above the second chamber 284. The first slot unit 264 may define slots 290 and the second slot unit 266 may define slots 292. The base unit 262 may be sized for an upper frame, such as the upper frame unit 204, to be mounted thereto. The slots 290 and the slots 292 may be arranged with the upper frame unit 204 such that a path may be defined in which coolant may flow through the inlet 270 to the first chamber 282, through the slots 290 and into the inner channels 246 of the upper frame unit 204, through the slots 292 to enter the second chamber 284, and then exit the outlet 272. As such, coolant flowing through the inner channels 246 of the upper frame unit 204 may assist in managing thermal conditions of the power stages 245 adjacent thereto.

FIG. 6B shows an example of a portion of a power module assembly in which aspects of an upper unit and mid-unit of an assembly are each configured in two separate components. In this example, a base unit assembly 300 may include a base unit 302, a first mid-unit 304, a second mid-unit 306, a first upper unit 308, and a second upper unit 310. The base unit 302 may include an inlet 314, an outlet 316, and a partition 318. The partition 318 may split a portion of the cavity of the base unit 302 into a first chamber 320 and a second chamber 322. The inlet 314 may be open to the first chamber 320 and the outlet 316 may be open to the second chamber 322. The base unit 302 may define a ridge 326 in each chamber to assist in supporting the first mid-unit 304 and the second mid-unit 306.

For example, the first mid-unit 304 may be sized for disposal within the cavity of the base unit 302, upon the ridge 326, and above the first chamber 320. The second mid-unit 306 may be sized for disposal within the cavity of the base unit 302, upon the ridge 326, and above the second chamber 322. The first upper unit 308 may be sized for mounting to the first mid-unit 304 and such that the first upper unit 308 is disposed within the cavity of the base unit 302. The second upper unit 310 may be sized for mounting to the second mid-unit 306 and such that the second upper unit 310 is disposed within the cavity of the base unit.

The first mid-unit 304 may define one or more ports 330. The one or more ports 330 may be spaced apart from one another. The second mid-unit 306 may define one or more ports 332. The one or more ports 332 may be spaced apart from one another. The first upper unit 308 may define slots 336 and the second upper unit 310 may define slots 338. The base unit 302 may be sized for an upper frame, such as the upper frame unit 204, to be mounted thereto. The ports and slots may be arranged with the upper frame unit 204 such that a path may be defined in which coolant may flow through the inlet 314 to the first chamber 320, through the ports 330 and the slots 336, and into the inner channels 246 of the upper frame unit 204. The coolant may then flow through the slots 338 and the ports 332 into the second chamber 322 enroute to the outlet 316. As such, coolant flowing through the inner channels 246 of the upper frame unit 204 may assist in managing thermal conditions of the power stages 245 adjacent thereto.

FIG. 6C shows an example of a base unit assembly for a power module assembly, referred to generally as a base unit assembly 360. In this example, a base unit assembly 360 may include a first base unit 364, a second base unit 366, a first mid-unit 368, a second mid-unit 370, a first upper unit 372, and a second upper unit 374. The first base unit 364 may include an inlet 376 and the second base unit 366 may include an outlet 378. The first base unit 364 may define a first chamber 380 and the second base unit 366 may define a second chamber 382. The inlet 376 may be open to the first chamber 380 and the outlet 378 may be open to the second chamber 382. The first base unit 364 may define a first ridge 384 and the second base unit 366 may define a second ridge 386. The ridges may be sized to assist in supporting the respective mid-units and upper units.

For example, the first mid-unit 368, the second mid-unit 370, the first upper unit 372, and the second upper unit 374 may be sized for disposal within the cavities and upon the ridges of the first base unit 364 and the second base unit 366. The first upper unit 372 may be sized for mounting to the first mid-unit 368 and such that the two units are disposed within the cavity of the first base unit 364 and above the first chamber 380. The second upper unit 374 may be sized for mounting to the second mid-unit 370 and such that the two units are disposed within the cavity of the second base unit 366 and above the second chamber 382.

The first mid-unit 368 may define one or more ports 388. The one or more ports 388 may be spaced apart from one another. The second mid-unit 370 may define one or more ports 390. The one or more ports 390 may be spaced apart from one another. The first upper unit 372 may define slots 392 and the second upper unit 374 may define slots 394. The first base unit 364 and the second base unit 366 may be sized for an upper frame, such as the upper frame unit 204, to be mounted thereto. The ports and slots may be arranged with the upper frame unit 204 such that a path may be defined in which coolant may flow through the inlet 376 to the first chamber 380, through the ports 388 and the slots 392 and into the inner channels 246 of the upper frame unit 204. The coolant may then flow through the slots 394 and the ports 390 into the second chamber 382 enroute to the outlet 378. As such, coolant flowing through the inner channels 246 of the upper frame unit 204 may assist in managing thermal conditions of the power stages 245 adjacent thereto.

Portions of a base unit assembly may also be mounted upon a base unit instead of within a cavity of the base unit. FIG. 7 shows an example of a portion of a power module assembly, referred to as a base unit assembly 400 herein. In this example, a base unit 402 supports a mid-unit 404 and an upper unit 406. The mid-unit 404 and the upper unit 406 are sized for mounting upon the base unit 402. The base unit 402, the mid-unit 404, and the upper unit 406 may include features as described above to deliver and remove coolant from channels of an upper frame unit, such as the inner channels 246 of the upper frame unit 204 to assist in managing thermal conditions of power stages adjacent thereto.

FIG. 8 shows an example of a base unit assembly of a power module assembly in which an upper unit 420 includes flow guides 422. Similar to the embodiments described above, a base unit 423 may support a mid-unit 425 and the upper unit 420. The base unit 423 and the mid-unit 425 may include features to direct coolant flow as described above. The flow guides 422 may be dispersed along or adjacent a central axis 424 of the upper unit 420. Each of the flow guides 422 may be located between slots 426 defined by the upper unit 420. The flow guides 422 may be sized to partially extend within inner channels of an upper frame unit, such as the inner channels 246 of the upper frame unit 204. The flow guides 422 may assist in directing coolant flow about an exterior surface of power stages, such as the power stages 245. Alternatively, the flow guides 422 may be defined by an upper frame unit, such as the upper frame unit 204.

FIG. 9 shows an example of a base unit assembly of a power module assembly in which aspects of a mid-unit and upper unit are combined. In this example, a base unit 450 supports a transition unit 452. The base unit 450 may include features to direct coolant flow as described above. The transition unit 452 may include features of the mid-units and upper units to direct coolant flow as described above. For example, the transition unit 452 may include flow guides 454 located between slots 456. The flow guides 454 may be dispersed along or adjacent a central axis 458. The flow guides 454 may be sized to partially extend within inner channels of an upper frame unit, such as the inner channels 246 of the upper frame unit 204. The flow guides 454 may assist in directing coolant flow about an exterior surface of power stages, such as the power stages 245. Alternatively, the flow guides 454 may be defined by an upper frame unit, such as the upper frame unit 204.

Figure 10:
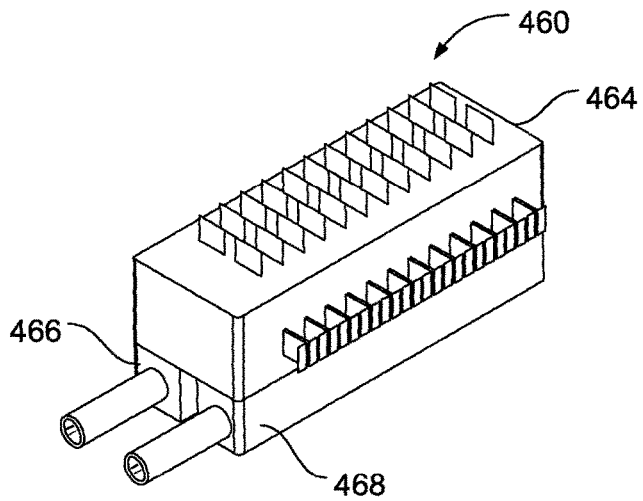
FIG. 10 is a perspective view of an example of portions of a power module assembly.
Figure 11:
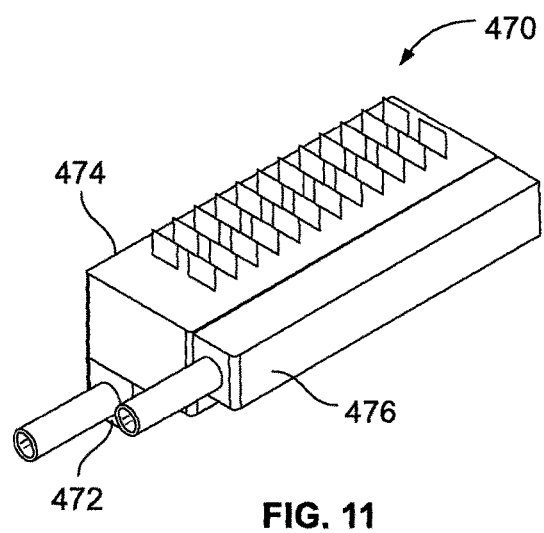
FIG. 11 is a perspective view of an example of portions of a power module assembly.
Figure 12:
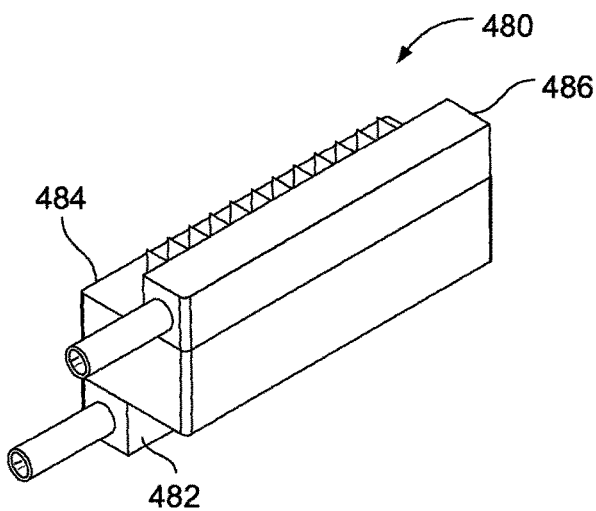
FIG. 12 is a perspective view of an example of portions of a power module assembly.

A modular or multi-component inlet/outlet unit assembly of a power module assembly may also provide multiple configuration options for the power module assembly. For example, FIG. 10 shows a power module assembly 460 including a multi-component base unit assembly supporting an upper frame unit 464. In this example, the base unit assembly may include an inlet unit 466 and an outlet unit 468 similar to the example described in relation to FIG. 6C. As another example, FIG. 11 shows a power module assembly 470 in which an inlet unit 472 is disposed below an upper frame unit 474 and an outlet unit 476 is mounted at a side portion of the upper frame unit 474. As yet another example, FIG. 12 shows a power module assembly 480 in which an inlet unit 482 is disposed below an upper frame unit 484 and an outlet unit 486 is mounted at an upper portion of the upper frame unit 484. The power module assembly 470 and the power module assembly 480 may each include chambers open to channels adjacent power stages housed with the respective upper frame unit. The multi-component inlet/outlet unit assemblies may provide multiple configuration options to address needs associated with packaging space in an environment of power module assemblies.

Figures 13, 14:
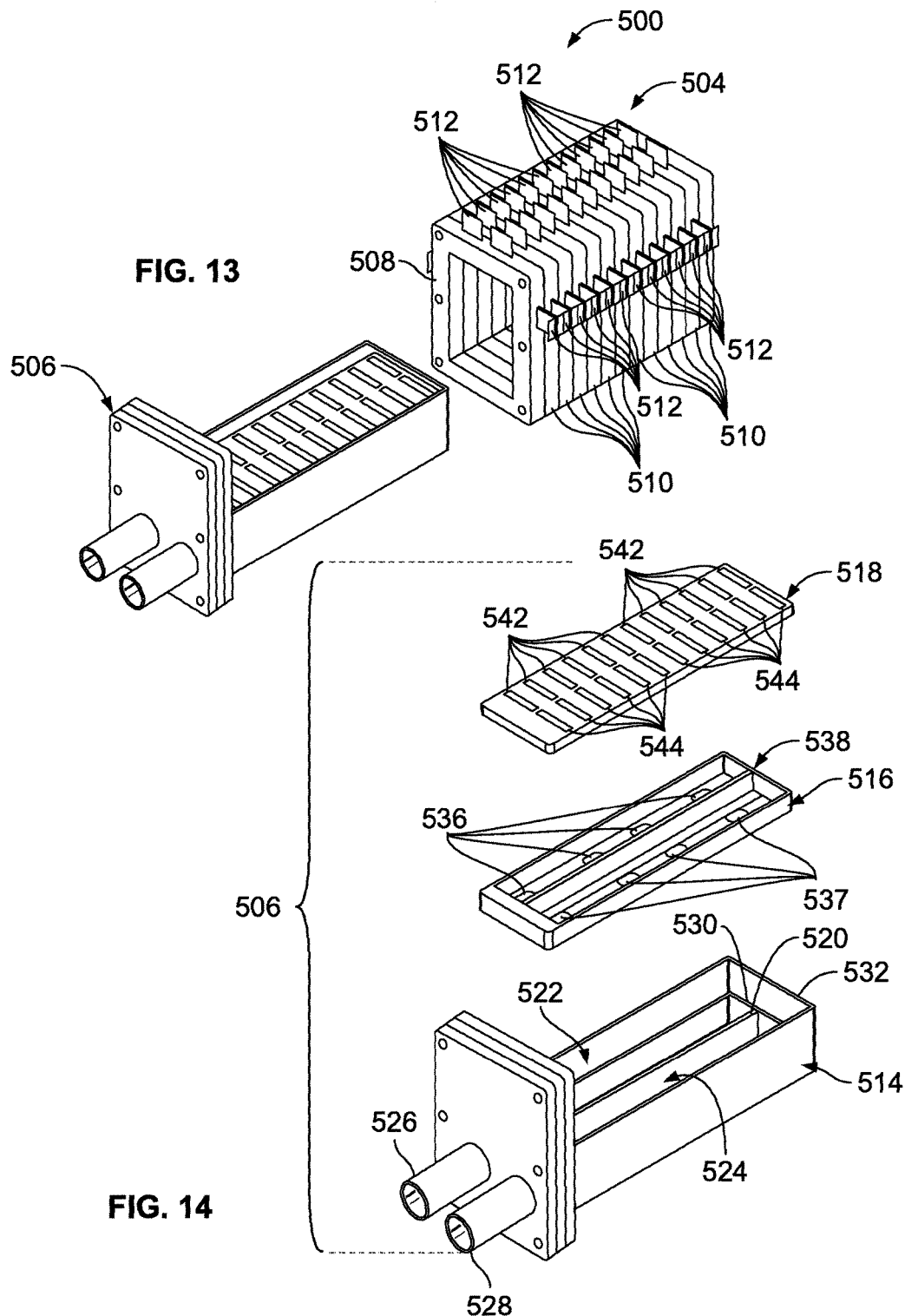
FIG. 13 is a partially exploded perspective view of an example of portions of a power module assembly including a base unit assembly and a frame unit assembly.
FIG. 14 an exploded perspective view of the base unit assembly of the power module assembly of FIG. 13.

FIG. 13 shows an example of a portion of a power module assembly for use with an electrified vehicle, referred to generally as a power module assembly 500 herein. The power module assembly 500 may include an upper frame unit 504 mounted to a base unit assembly 506. The upper frame unit 504 may house one or more power stages 508 therein. In this example, the upper frame unit 504 includes frames 510 stacked in an array. Each of the frames 510 may house one of the power stages 508. Electrical components 512 of the power stages 508 may extend through apertures defined by the respective frame 510.

FIG. 14 shows the base unit assembly 506 which may include multiple components. The base unit assembly 506 may include a base unit 514, a mid-unit 516, and an upper frame unit 518. The base unit 514 may include a partition 520 separating a first chamber 522 and a second chamber 524. An inlet 526 and an outlet 528 may be mounted to the base unit 514. The inlet 526 may be open to the first chamber 522 and the outlet 528 may be open to the second chamber 524. The base unit 514 may define a ridge 530 extending about a perimeter of the base unit 514 and spaced from an edge 532 of the base unit 514. For example, the ridge 530 may be spaced from the edge 532 such that the mid-unit 516 and the upper frame unit 518 may rest thereupon and within the base unit 514.

The mid-unit 516 may define a first set of one or more ports 536, a second set of one or more ports 537, and a wall 538. The ports of each set may be spaced apart from one another. The first set of the ports 536 may be separated from the second set of the ports 537 by the wall 538. The wall 538 may span a length of the mid-unit 516. The upper frame unit 518 may define a first set of slots 542 and a second set of slots 544. The slots of each set may be spaced from one another. A screen may be disposed in each of the slots 542 and the slots 544 to influence flow of coolant traveling therethrough.

As mentioned above, the upper frame unit 504 may house one or more power stages 508 therein. The power stages 508 may be spaced apart from one another to define inner channels therebetween. The inner channels may operate as a path for coolant to flow therethrough and such that the coolant may assist in managing thermal conditions of the power stages 508. For example, coolant flowing through the inner channels may draw heat from the power stages 508. Examples of the electrical components 512 include semiconductors, a direct current (DC) terminal, an alternating (AC) terminal, and busbars. The electrical components 512 may extend through the upper frame unit 204 for electrical connection with other vehicle components.

The upper frame unit 518 and the base unit assembly 506 may be arranged with one another such that the inner channels of the upper frame unit 518 are in fluid communication with the first chamber 522 and the second chamber 524. For example, the inner channels may align with the slots 542 and the slots 544 (or other examples of slots described herein) such that coolant flowing from the first chamber 522 may then pass through the respective ports 536 and the slots 542 enroute to the inner channels to draw heat from the power stages 508. The coolant may then flow from the inner channels through the slots 544 and the respective ports 537 enroute to the second chamber 524.

Figure 16:
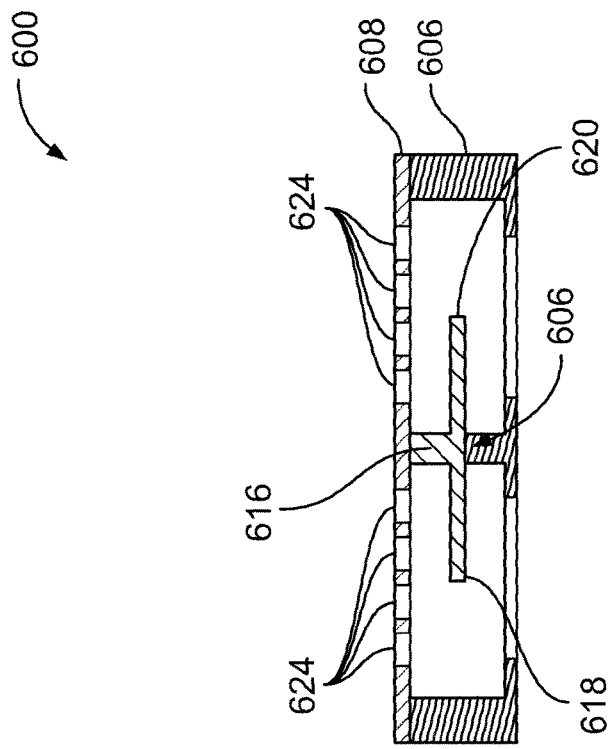
FIG. 16 is a front view, in cross-section, of portions the power module assembly of FIG. 15.
Figure 15:
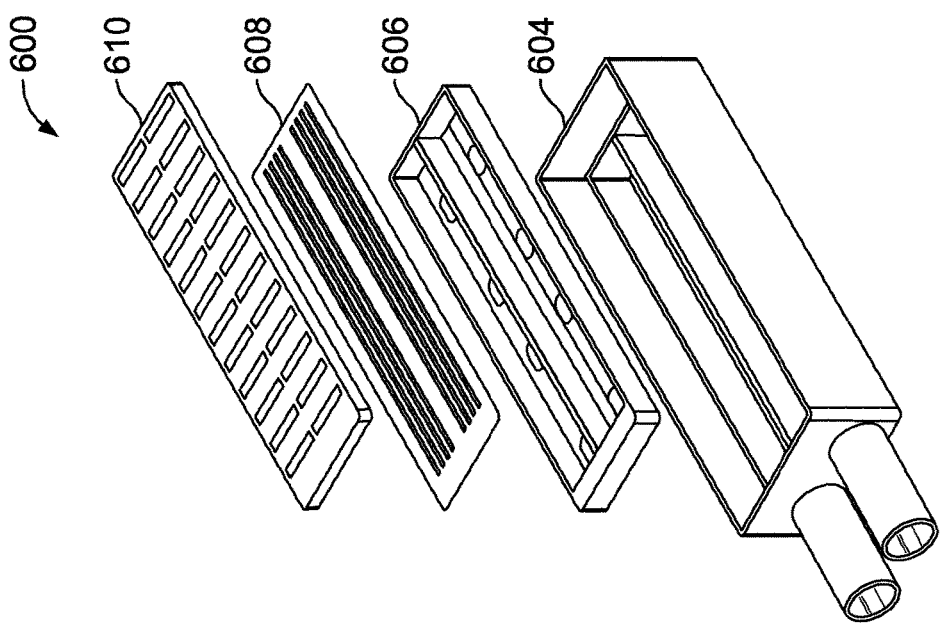
FIG. 15 is a perspective view of an example of portions of a power module assembly.

FIGS. 15 and 16 show another example of a portion of a power module assembly, referred to as a power module assembly 600 herein. The power module assembly 600 may include a base unit 604, a mid-unit 606, an insert unit 608, and an upper unit 610. In this example, channels and ports of the base unit 604, the mid-unit 606, and the upper unit 610 have a similar relationship to the embodiments described above. However, the insert unit 608 may be arranged with the mid-unit 606 to influence coolant flow therein. For example, the insert unit 608 may be sized for a lower portion 614 to be disposed within the mid-unit 606. The lower portion 614 may divide the mid-unit 606 into two chambers. The lower portion 614 may include a wall 616, a first extension 618, and a second extension 620. The first extension 618 and the second extension 620 may extend into respective chambers of the mid-unit 606 to assist in influencing coolant flow traveling from the base unit 604 to the upper unit 610 via ports 624.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power module assembly comprising:
a modular manifold including base units defining inlet and outlet chambers, a mid-unit defining ports open to the chambers, and an upper unit defining slots fluidly connected to the chambers via the ports; and
a frame supported by the manifold and housing power stages defining inner channels between one another, wherein the chambers, channels, and ports are arranged so coolant flowing therethrough thermally communicates with the power stages.

2. The assembly of claim 1, wherein the mid-unit further comprises flow guides spaced apart from one another and each sized to extend into one of the inner channels, and wherein the flow guides direct coolant flowing therethrough about exterior surfaces of each of the power stages.

3. The assembly of claim 1, wherein the mid-unit comprises a first mid-unit sized for disposal within a cavity defined by one of the base units and defines a first set of the ports, and a second mid-unit sized for disposal within a cavity defined by the other of the base units and defines a second set of the ports.

4. The assembly of claim 3, wherein each of the cavities are sized such that the mid-unit and upper unit are located above the inlet chamber and outlet chamber.

5. The assembly of claim 1, further comprising an inlet open to the inlet chamber and an outlet open to the outlet chamber.

6. The assembly of claim 1, wherein the mid-unit and upper unit are formed as a single component.

7. The assembly of claim 1, wherein the mid-unit further defines a wall dividing a cavity of the mid-unit such that the ports are not all in fluid communication with one another when the upper unit is mounted to the mid-unit.

8. A vehicle power module assembly comprising: a modular manifold including two component base units, a mid-unit disposed upon the two component base units, and an upper unit disposed upon the mid-unit; an upper frame housing power stages spaced from one another to define inner channels each open to one of two base unit cavities via transition channels of the mid-unit; and an inlet and outlet each open to one of the two base unit cavities such that coolant travels therebetween via the cavities and the channels, wherein the upper unit includes flow guides spaced from one another and each extending into one of the inner channels and defining a guide plane parallel with a partition plane defined by the partition.

9. The assembly of claim 8, wherein the upper frame further comprises a plurality of frames each sized to house one of the power stages.

10. The assembly of claim 8, wherein each of the power stages includes electrical components extending therefrom, and wherein the upper frame is over molded about the power stages such that the electrical components extend therethrough.

11. The assembly of claim 8, further comprising screens disposed within each transition channel defined by the mid-unit to influence a flow of coolant traveling therethrough.

12. The assembly of claim 8, wherein each of the two component base units further defines a ridge extending about a perimeter of a respective base unit cavity sized for the upper frame to rest thereupon.

13. A multi-component manifold for a power module assembly comprising:
- a base unit including an inlet and an outlet, and defining an inlet chamber open to the inlet and an outlet chamber open to the outlet;
- a mid-unit sized for mounting to the base unit and defining a plurality of spaced ports separated from one another by a mid-unit wall; and
- an upper unit sized for mounting to the mid-unit and defining a first set of slots open to the inlet chamber via respective ports and a second set of slots open to the outlet chamber via respective ports,
- wherein the units are arranged with one another to receive an upper frame thereupon and such that inner channels of the upper frame are in fluid communication with the chambers for coolant to flow therethrough and in fluid communication with power stages disposed adjacent the inner channels.

14. The manifold of claim 13, wherein the units are further arranged with one another to receive the upper frame over molded upon the power stages.

15. The manifold of claim 13, wherein the units are further arranged with one another to receive the upper frame comprising a stack of frames.

16. The manifold of claim 13, wherein the base unit further defines a ridge offset from an upper edge of the base unit such that the mid-unit rests upon the ridge and within an upper portion of the base unit.

17. The manifold of claim 13, wherein the upper unit include a set of flow guides located along a central axis, spaced apart from one another, extending from between two of the slots, and each sized to extend into one of the inner channels, and wherein the flow guides direct coolant flowing therethrough about exterior surfaces of each of the power stages.

18. The manifold of claim 13 further comprising an insert unit including a lower portion sized for disposal within a cavity of the mid-unit, wherein the lower portion separates the cavity of the mid-unit into two chambers and includes extensions to influence a flow of coolant therein.

* * * * *